(12) United States Patent
Anderson et al.

(10) Patent No.: US 10,390,434 B2
(45) Date of Patent: Aug. 20, 2019

(54) LAMINATE-BASED PACKAGE WITH INTERNAL OVERMOLD

(71) Applicant: Qorvo US, Inc., Greensboro, NC (US)

(72) Inventors: Kevin J. Anderson, Plano, TX (US);
Tarak A. Railkar, Plano, TX (US);
Walid M. Meliane, Frisco, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/154,065

(22) Filed: Oct. 8, 2018

(65) Prior Publication Data

US 2019/0116670 A1    Apr. 18, 2019

Related U.S. Application Data

(60) Provisional application No. 62/571,974, filed on Oct. 13, 2017.

(51) Int. Cl.
| | |
|---|---|
| *H05K 1/18* | (2006.01) |
| *H05K 5/00* | (2006.01) |
| *H01Q 9/04* | (2006.01) |
| *H05K 1/02* | (2006.01) |

(52) U.S. Cl.
CPC ............ *H05K 1/185* (2013.01); *H01Q 9/0407* (2013.01); *H05K 1/021* (2013.01); *H05K 1/181* (2013.01); *H05K 5/0034* (2013.01)

(58) Field of Classification Search
CPC ........ H05K 1/181; H05K 1/182; H05K 1/183; H05K 1/184; H05K 1/185; H05K 1/186; H05K 1/187; H05K 1/188
See application file for complete search history.

(56) References Cited

PUBLICATIONS

Amkor Technology, "Package on Package (PoP) Family," Data Sheet, Available online at: <<https://c44f5d406df450f4a66b-1b94a87d576253d9446df0a9ca62e142.ssl.cf2.rackcdn.com/2018/02/PoP_DS586.pdf>>, Revised Dec. 2012, Accessed Oct. 12, 2017, 4 pages.
Amkor Technology, "Package on Package (PoP) | PSfvBGA | PSfcCSP | TMV® PoP)," Available online at: <<http://www.amkor.com/go/Package-on-Package<<, 2003-2017, Accessed Oct. 12, 2017, 5 pages.
Chin, Spencer, "Flexible BGA hurdles cost barrier," Electronic Products, Available online at: <<http://www.electronicproducts.com/Passive_Components/Flexible_BGA_hurdles_cost_barrier.aspx>>, Dec. 1, 1997, Accessed Oct. 12, 2017, 3 pages.

(Continued)

*Primary Examiner* — Jeremy C Norris
(74) *Attorney, Agent, or Firm* — Withrow & Terranova, P.L.L.C.

(57) ABSTRACT

The present disclosure relates to a microelectronic package, which includes a base substrate, a perimeter wall, an electronic component, and a mold compound. The perimeter wall extends from a periphery of the base substrate to form a cavity that is over the base substrate and within the perimeter wall. The electronic component is mounted on the base substrate and exposed to the cavity. The electronic component is thermally coupled to a thermal management component, which extends through the base substrate and conducts heat generated from the electronic component. The electronic component is also electrically coupled to a wall signal via, which extends through the perimeter wall and transmits signals. The mold compound resides over the base substrate and within the cavity, so as to encapsulate the electronic component.

20 Claims, 6 Drawing Sheets

(56) References Cited

PUBLICATIONS

Figure 1:
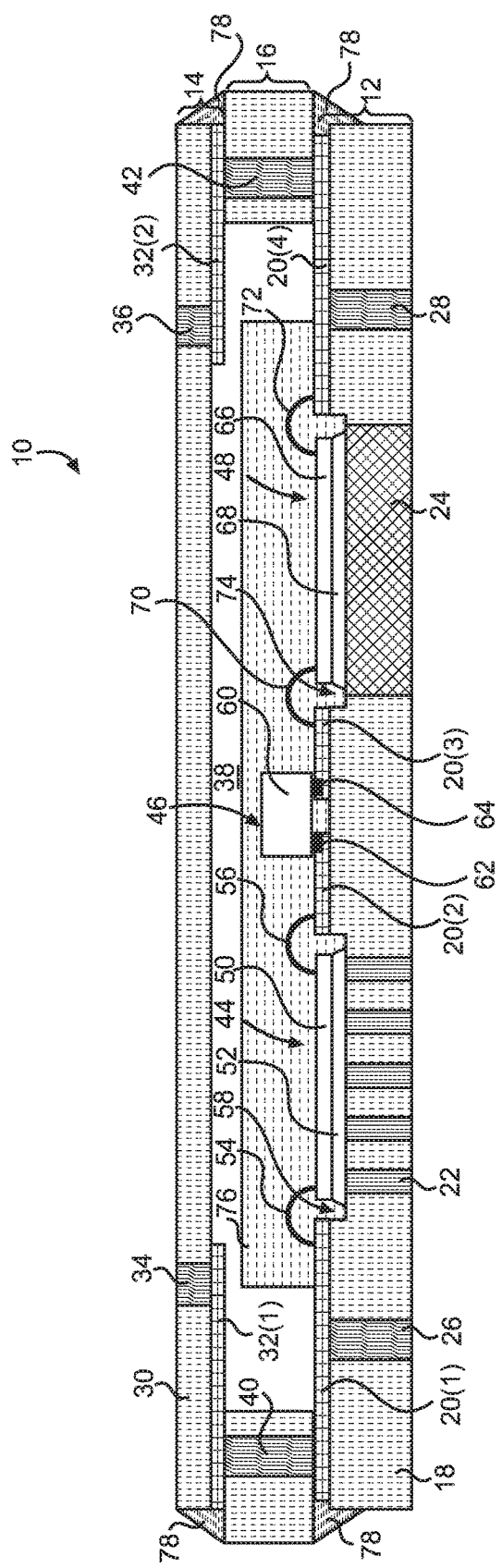

Naval Sea Systems Command, "Warfare Centers: NSWC Crane Division; SD-18 Microcircuits: Part Requirement & Application Guide," Available online at: <<http://www.navsea.navy.mil/Home/WarfareCenters/NSWCCrane/Resources/SD18/Products/Microcircuits/Packaging.aspx<<, Date Unknown, Accessed Oct. 12, 2017, 11 pages.

Schueller, R.D., et al., "Performance and Reliability of a Cavity Down Tape BGA Package," Proceedings of the 1997 1st Electronic Packaging Technology Conference, Oct. 10, 1997, Singapore, Singapore, 12 pages.

Smithsonian Chips, "IC Packaging—Part I," Series 9: Integrated Circuit Engineering Collection, ICECAP Reports, Available online at: <<http://smithsonianchips.si.edu/ice/package.htm>>, Feb. 10, 1982, Accessed Oct. 12, 2017, 11 pages.

Subtron Technology Co., Ltd., Home Page, Available online at: <<www.subtron.com.tw>>, 2012, Accessed Dec. 11, 2018, 1 page.

LAMINATE-BASED PACKAGE WITH INTERNAL OVERMOLD

RELATED APPLICATIONS

This application claims the benefit of provisional patent application Ser. No. 62/571,974, filed Oct. 13, 2017, the disclosure of which is hereby incorporated herein by reference in its entirety.

FIELD OF THE DISCLOSURE

The present disclosure relates to a laminate-based package, and more particularly to a laminate-based package with an internal overmold to improve reliability in various environments.

BACKGROUND

In semiconductor packaging, electronic components, such as flip-chip dice and wire-bonded dice are preferred to be in proximity of low dielectric constant materials—such as air—for high frequency applications. Therefore, various air-cavity packages are leveraged for enabling a better high frequency device performance. However, the air-cavity packages may be vulnerable to reliability failures from moisture condensation (large excursions in temperature and humidity over relatively short periods of time) and/or contamination in applications. Accordingly, it is desirable to package the electronic components in a configuration that is more protective and reliable in external environments.

For conventional semiconductor packages, only one side of the package is typically used for signal transmission (radio frequency signal/direct current signal/grounding signal). Although this approach can help reduce cost of the component, doing so, often limits the levels of integration that can be achieved in some applications. In addition, thermal management of the conventional package and the signal transmission are normally supported on the same side of the package. This can pose a challenge for some high frequency applications, and may impact the quality and fidelity of the signal transmission.

Accordingly, there remains a need for improved package configuration to improve reliability in external environments with large changes in temperature, moisture, and/or resultant condensation conditions. Further, the improved package designs may include dual signal transition planes to enhance integration levels of the semiconductor packages, or separate the signal transmission and the heat dissipation to enhance the high frequency performance of the semiconductor packages.

SUMMARY

The present disclosure relates to a laminate-based package with an internal overmold. The disclosed package includes a base substrate, a perimeter wall, at least one electronic component, and a mold compound. The base substrate includes a base substrate body having an internal side and an external side, at least one base metal structure on the internal side of the base substrate body, and at least one thermal management component that extends through the base substrate body. The perimeter wall extends from a periphery of the internal side of the base substrate body to form a cavity that is over the internal side of the base substrate body and within the perimeter wall. Herein, at least one wall signal via extends through the perimeter wall and is electrically coupled to the at least one base metal structure on the internal side of the base substrate body. The at least one electronic component is mounted on the internal side of the base substrate body, exposed to the cavity, and electrically coupled to the at least one base metal structure. The at least one thermal management component is thermally coupled to the at least one electronic component and conducts heat generated from the at least one electronic component toward the external side of the base substrate body. The mold compound resides over the internal side of the base substrate body and within the cavity, so as to encapsulate the at least one electronic component.

In one embodiment of the package, the base substrate further includes at least one base signal via extending through the base substrate body. Herein, the at least one base signal via is electrically coupled to the at least one base metal structure on the internal side of the base substrate body and separate from the at least one thermal management component.

According to another embodiment, the package is included in a system assembly. Besides the package, the system assembly further includes a PCB and a patch antenna board. Herein, the external side of the base substrate body is over the PCB, such that the at least one base signal via is electrically coupled to the PCB and transmits signals between the at least one electronic component and the PCB. The patch antenna board resides over the perimeter wall, such that the at least one wall signal via is electrically coupled to the patch antenna board and transmits signals between the at least one electronic component and the patch antenna board. The cavity is enclosed and defined by a portion of the internal side of the base substrate body, the perimeter wall, and a portion of the patch antenna board.

In one embodiment of the package, the mold compound has an essentially same height as the perimeter wall and provides mechanical support to the patch antenna board.

In one embodiment of the package, the mold compound has a lower height than the perimeter wall, such that there is an air gap within the cavity.

In one embodiment of the package, the PCB includes at least one heat sink extending through the PCB. Herein, the at least one thermal management component is thermally coupled to the heat sink and conducts the heat generated from the at least one electronic component to the heat sink.

According to another embodiment, the package further includes a first junction formed between the perimeter wall and the patch antenna board, a second junction formed between the perimeter wall and the internal side of the base substrate body, and a sealing material that extends about an exterior portion of the first junction and an exterior portion of the second junction to enclose the cavity.

According to another embodiment, the package is included in a system assembly. Besides the package, the system assembly further includes a PCB and a patch antenna board. Herein, the package further includes a secondary substrate over the perimeter wall. The secondary substrate includes a secondary substrate body having an internal side and an external side, at least one secondary metal structure on the internal side of the secondary substrate body, and at least one secondary signal via extending through the secondary substrate body. The internal side of the secondary substrate body is coupled to the perimeter wall, and the at least one secondary signal via and the at least one wall signal via are electrically coupled to the at least one secondary metal structure on the internal side of the secondary substrate body. The cavity is enclosed and defined by a portion of the internal side of the base substrate body, the perimeter wall, and a portion of the internal side of the secondary substrate body. In addition, the external side of the base substrate body is over the PCB, such that the at least one base signal via is electrically coupled to the PCB and transmits signals between the at least one electronic component and the PCB. The patch antenna board is over the external side of the secondary substrate body, such that the at least one secondary signal via is electrically coupled to the patch antenna board and transmits signals between the at least one electronic component and the patch antenna board.

According to another embodiment, the package is included in a system assembly. Besides the package, the system assembly further includes a PCB and a cold plate. Herein, the package further includes a secondary substrate over the perimeter wall. The secondary substrate includes a secondary substrate body having an internal side and an external side, at least one secondary metal structure on the internal side of the secondary substrate body, and at least one secondary signal via extending through the secondary substrate body. The internal side of the secondary substrate body is coupled to the perimeter wall, and the at least one secondary signal via and the at least one wall signal via are electrically coupled to the at least one secondary metal structure on the internal side of the secondary substrate body. In addition, the cavity is enclosed and defined by a portion of the internal side of the base substrate body, the perimeter wall, and a portion of the internal side of the secondary substrate body. In addition, the external side of the secondary substrate body is over the PCB, such that the at least one secondary signal via is electrically coupled to the PCB and transmits signals between the at least one electronic component and the PCB. The cold plate is over the external side of the base substrate body, such that the at least one thermal management component is thermally coupled to the cold plate and conducts the heat generated from the at least one electronic component to the cold plate.

In one embodiment of the package, the at least one electronic component is one of a resistor, a capacitor, an inductor, a flip-chip die, a filter, a battery function die, and a wire-bonding die.

In one embodiment of the package, the at least one thermal management component includes a number of thermal vias.

In one embodiment of the package, the at least one thermal management component includes a slug.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides an exemplary laminate-based package according to one embodiment of the present disclosure.

Figure 2:
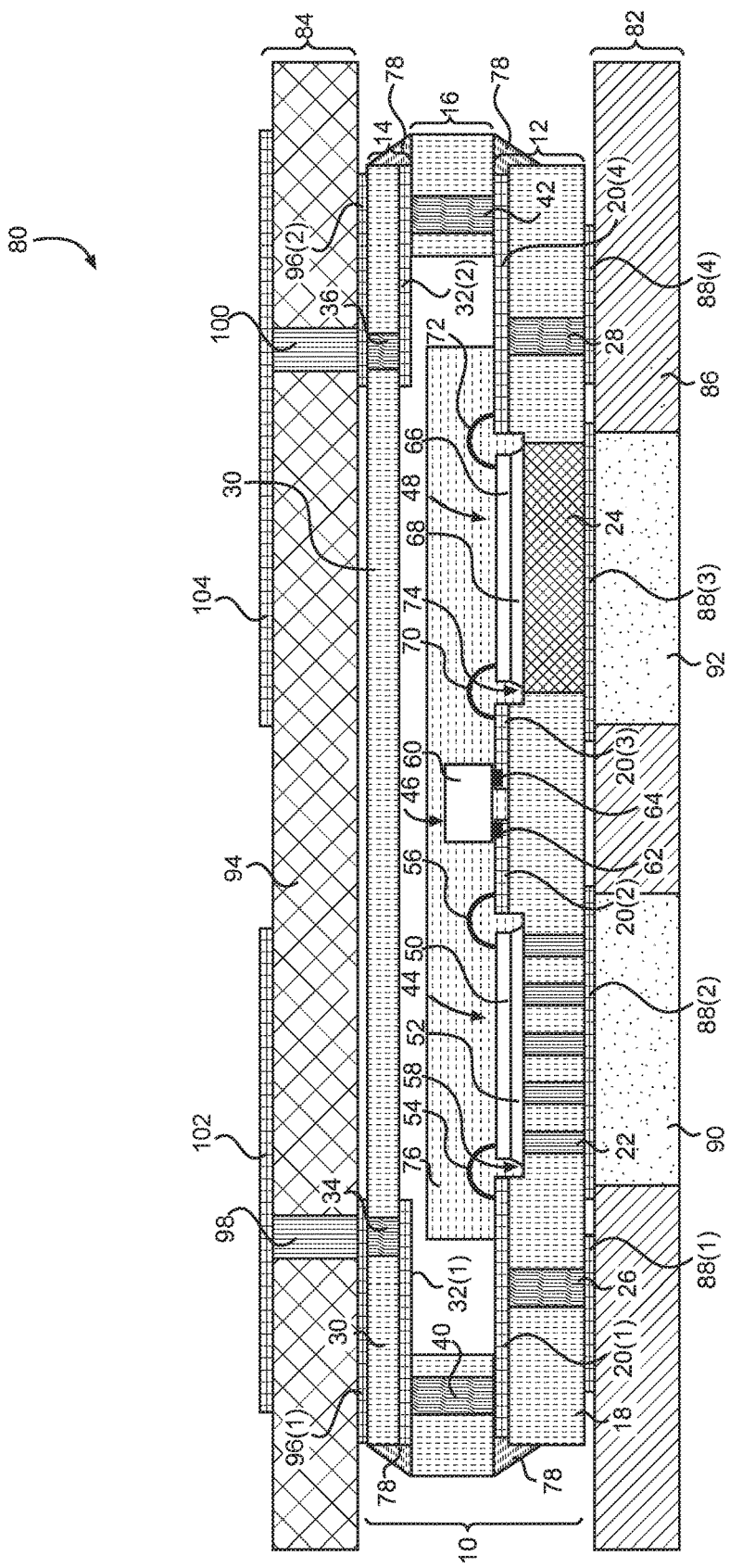

FIG. 2 provides an exemplary system assembly including the exemplary laminate-based package shown in FIG. 1.

Figure 3:
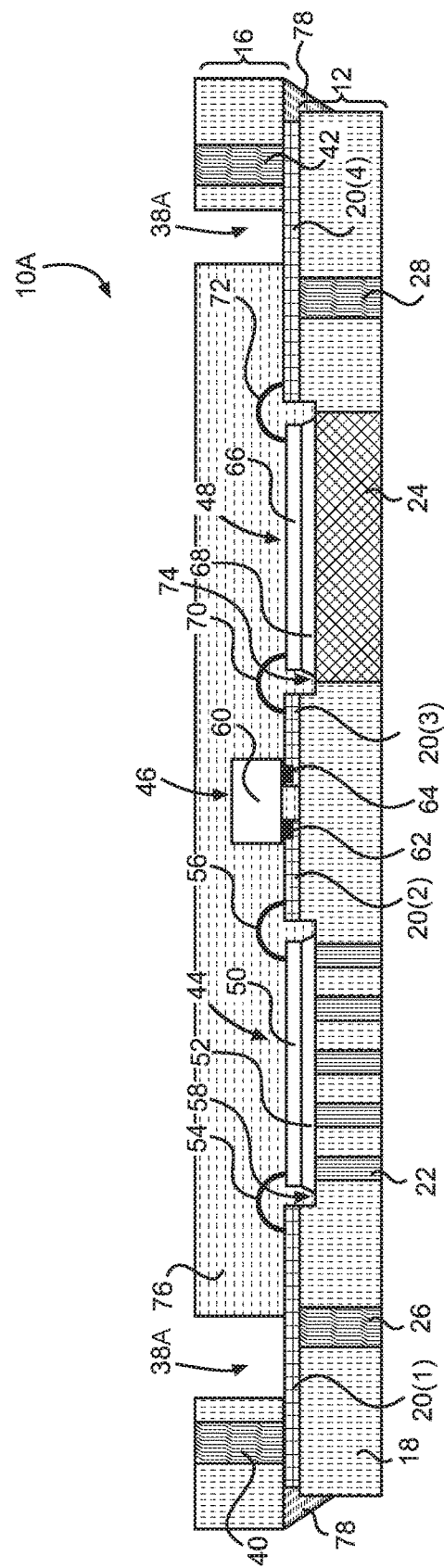

FIG. 3 provides an alternative laminate-based package according to one embodiment of the present disclosure.

Figure 4:
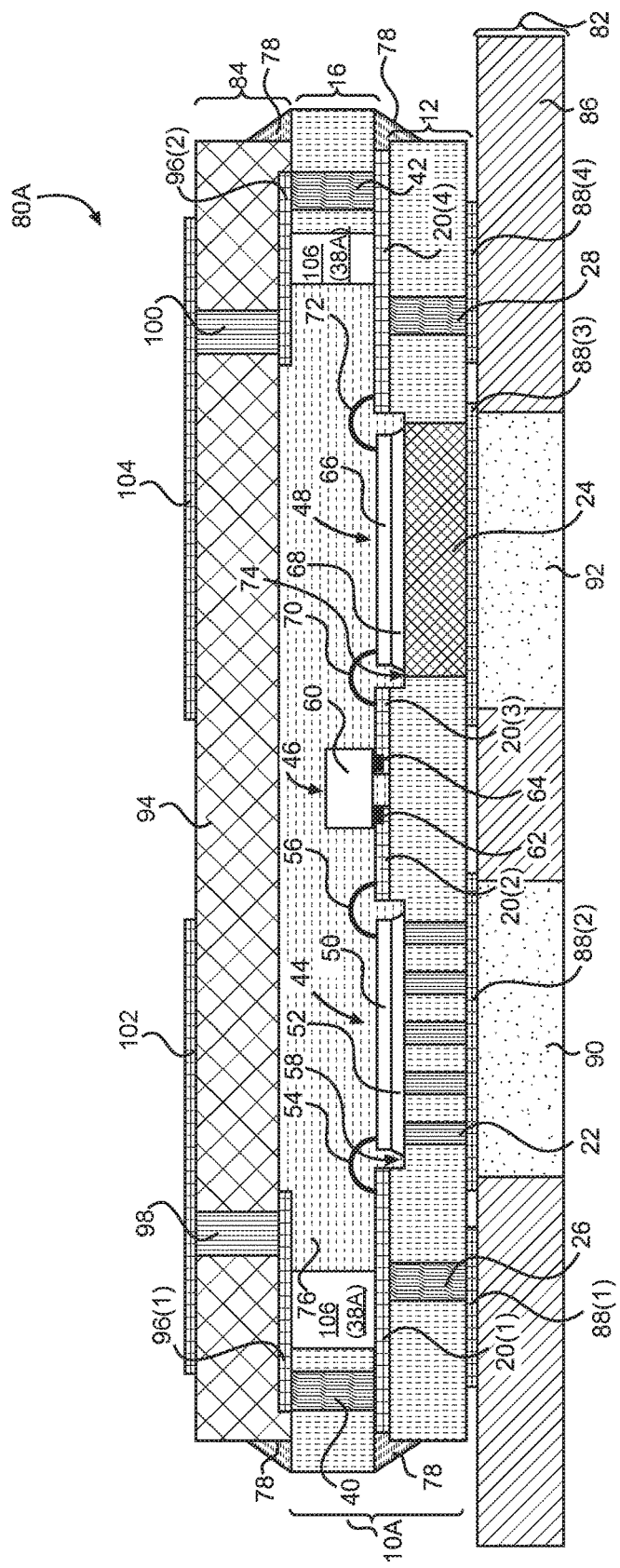

FIG. 4 provides an exemplary system assembly including the alternative laminate-based package shown in FIG. 3.

Figure 5:
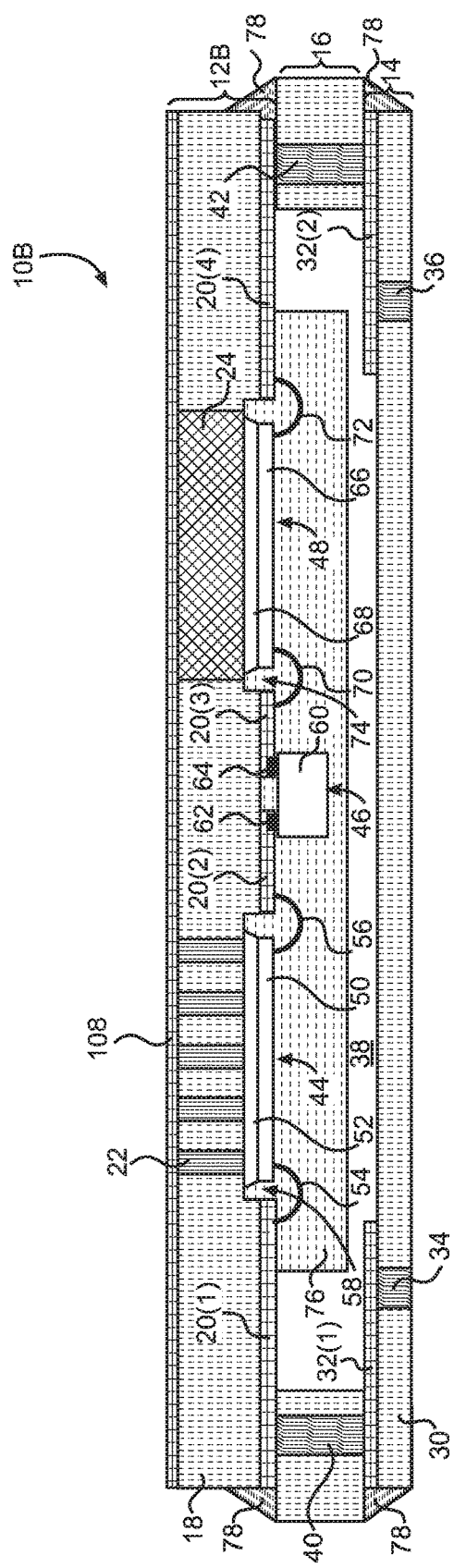

FIG. 5 provides an alternative laminate-based package according to one embodiment of the present disclosure.

Figure 6:
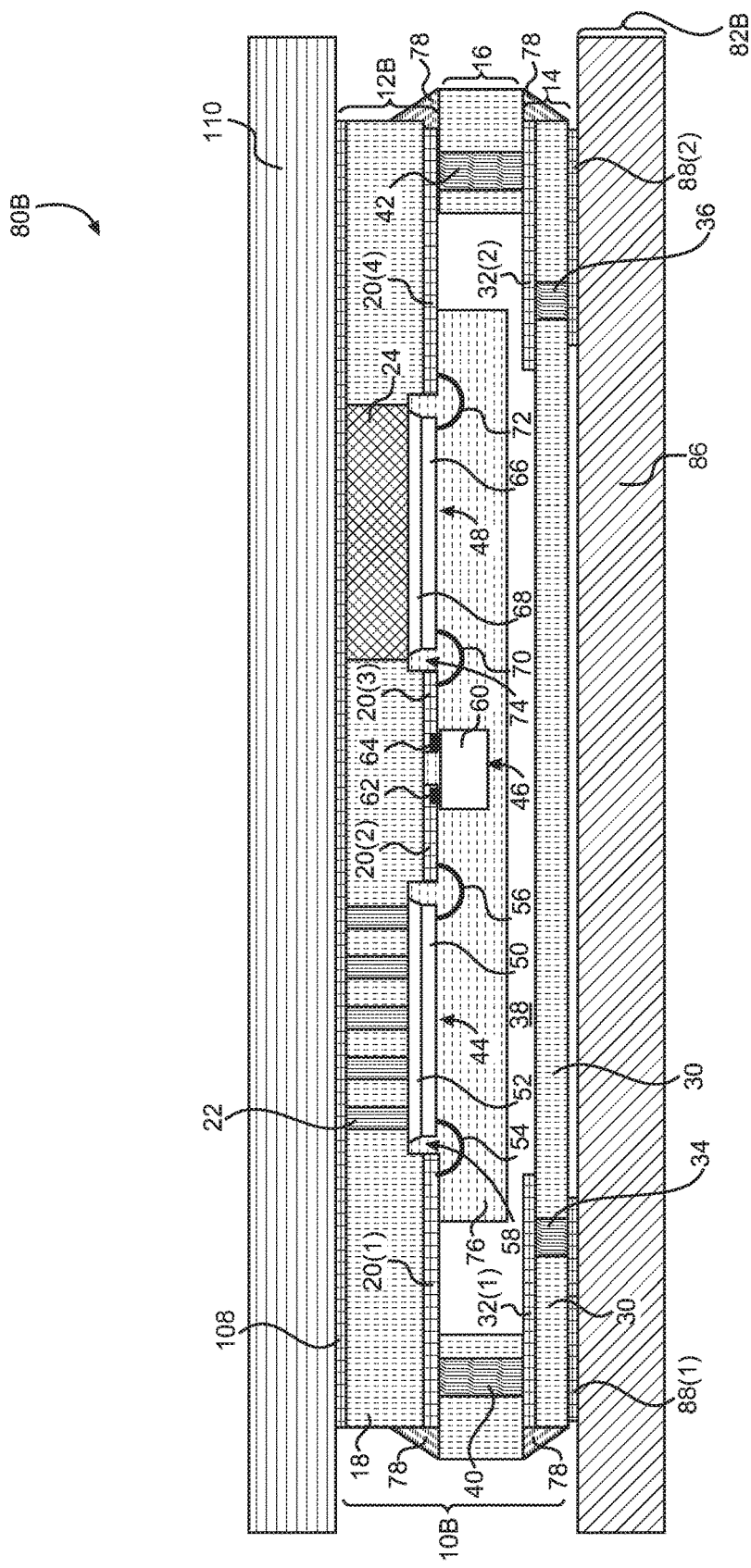

FIG. 6 provides an alternative system assembly including the alternative laminate-based package shown in FIG. 5.

It will be understood that for clear illustrations, FIGS. 1-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 provides an exemplary package 10 according to one embodiment of the present disclosure. In this embodiment, the package 10 includes a base substrate 12 that may be a multi-layer laminate substrate, a secondary substrate 14 that may be a multi-layer laminate substrate, and a perimeter wall 16 that may be a multi-layer laminate wall. For the purpose of this illustration, the base substrate 12 includes a base substrate body 18 having an internal side and an external side, a base metal layer 20 on the internal side of the base substrate body 18, a number of thermal vias 22 (only one thermal via is labeled with reference number for clarity), a heat spreader 24 (such as a slug), a first base signal via 26, and a second base signal via 28. Herein, the base metal layer 20 includes four separate metal structures: a first base metal structure 20(1), a second base metal structure 20(2), a third base metal structure 20(3), and a fourth base metal structure 20(4). These base metal structures 20(1)-20(4) of the base metal layer 20 may be formed as metal pads and/or traces. In different applications, the base substrate 12 may include fewer or more thermal vias, fewer or more heat spreaders, and fewer or more base signal vias (the first/second base signal vias 26/28). Further, the base metal layer 20 may include fewer or more base metal structures.

Both the thermal vias 22 and the heat spreader 24 are thermal management components. The thermal vias 22 extend from the internal side of the base substrate body 18 through the base substrate body 18 to the external side of the base substrate body 18. The thermal vias 22 may be formed by drilling corresponding holes through the base substrate body 18 and filling the holes with thermal conductive epoxy or plating the holes with copper. The heat spreader 24 also extends from the internal side of the base substrate body 18 through the base substrate body 18 to the external side of the base substrate body 18. The heat spreader 24 may be formed from a material such as copper and have a thermal conductivity of at least 50 W/m·K.

The first base signal via 26 extends from the internal side of the base substrate body 18 through the base substrate body 18 to the external side of the base substrate body 18 and is electrically coupled to the first base metal structure 20(1) of the base metal layer 20. The second base signal via 28 extends from the internal side of the base substrate body 18 through the base substrate body 18 to the external side of the base substrate body 18 and is electrically coupled to the fourth base metal structure 20(4) of the base metal layer 20. Both the first and second base signal vias 26 and 28 are electrically conductive.

For the purpose of this illustration, the secondary substrate 14 includes a secondary substrate body 30 having an internal side and an external side, a secondary metal layer 32 on the internal side of the secondary substrate body 30, a first secondary signal via 34 and a second secondary signal via 36. Herein, the secondary metal layer 32 includes two separate metal structures: a first secondary metal structure 32(1) and a second secondary metal structure 32(2). These secondary metal structures 32(1)-32(2) of the secondary metal layer 32 may be formed as metal pads and/or traces. In different applications, the secondary substrate 14 may include fewer or more secondary signal vias (the first/second secondary signal vias 34/36). Further, the secondary metal layer 32 may include fewer or more secondary metal structures.

The first secondary signal via 34 extends from the internal side of the secondary substrate body 30 through the secondary substrate body 30 to the external side of the secondary substrate body 30 and is electrically coupled to the first secondary metal structure 32(1) of the secondary metal layer 32. The second secondary signal via 36 extends from the internal side of the secondary substrate body 30 through the secondary substrate body 30 to the external side of the secondary substrate body 30 and is electrically coupled to the second secondary metal structure 32(2) of the secondary metal layer 32. Both the first and second secondary signal vias 34 and 36 are electrically conductive.

The perimeter wall 16 extends from a periphery of the internal side of the base substrate body 18 to a periphery of the internal side of the secondary substrate body 30. As such, a cavity 38 is defined by a portion of the internal side of the base substrate body 18, the perimeter wall 16, and a portion of the internal side of the secondary substrate body 30. In this embodiment, the cavity 38 is enclosed. For the purpose of this illustration, the perimeter wall 16 includes two separate wall signal vias: a first wall signal via 40 and a second wall signal via 42. The first wall signal via 40 extends through the perimeter wall 16, and is electrically coupled to the first base metal structure 20(1) of the base metal layer 20 and the first secondary metal structure 32(1) of the secondary metal layer 32. The second wall signal via 42 also extends through the perimeter wall 16, and is electrically coupled to the fourth base metal structure 20(4) of the base metal layer 20 and the second secondary metal structure 32(2) of the secondary metal layer 32.

In addition, the package 10 also includes a number of electronic components mounted on the base substrate 12. For the purpose of this illustration, the air-cavity package 10 includes a first wire-bonding die 44, a surface mounted device (SMD) 46, and a second wire-bonding die 48, which are mounted on the internal side of the base substrate body 18 and exposed to the cavity 38. In different applications, the package 10 may include fewer or more wire-bonding dies and SMDs.

The first wire-bonding die 44 includes a first die body 50 mounted on the internal side of the base substrate body 18 via a first die-attach material 52, a first bonding wire 54, and a second bonding wire 56. The first bonding wire 54 extends from a top surface of the first die body 50 and is electrically coupled to the first base metal structure 20(1) of the base metal layer 20. The second bonding wire 56 extends from the top surface of the first die body 50 and is electrically coupled to the second base metal structure 20(2) of the base metal layer 20. In different applications, the first wire-bonding die 44 may include more bonding wires. In this embodiment, the internal side of the base substrate body 18 may not have a flat surface and may have a first recess 58, in which the first wire-bonding die 44 is mounted. Herein, the thermal vias 22 are thermally coupled to the first wire-bonding die 44 and conduct heat generated from the first wire-bonding die 44 toward the external side of the base substrate body 18. The thermal vias 22 are directly in a heat dissipation path and adjacent to the first wire-bonding die 44. The first base signal via 26 and the first wall signal via 40 are electrically coupled to the first wire-bonding die 44 through the first base metal structure 20(1) of the base metal layer 20. The first base signal via 26 is not directly in a heat dissipation path.

The SMD 46 includes a SMD body 60, a first SMD interconnect 62, and a second SMD interconnect 64. The first SMD interconnect 62 extends outward from a bottom surface of the SMD body 60 and is coupled to the second base metal structure 20(2) of the base metal layer 20. The second SMD interconnect 64 extends outward from the bottom surface of the SMD body 60 and is coupled to the third base metal structure 20(3) of the base metal layer 20. In different applications, the SMD 46 may include more SMD interconnects. The SMD 46 may be a resistor, a capacitor, an inductor, a flip-chip die, a filter (such as a surface-acoustic-wave filter, a bulk-acoustic-wave filter, and one realized through other technologies), or a battery function die. If the SMD 46 is a significant heat generator, there may be a thermal management component (not shown) thermally coupled to the SMD 46 and conducting heat generated from the SMD 46 toward the external side of the base substrate body 18.

The second wire-bonding die 48 includes a second die body 66 mounted on the internal side of the base substrate body 18 via a second die-attach material 68, a third bonding wire 70, and a fourth bonding wire 72. The first attach material 52 and the second attach material 68 may be formed of an epoxy, a suitable solder or sintered materials. The third bonding wire 70 extends from a top surface of the second die body 66 and is electrically coupled to the third base metal structure 20(3) of the base metal layer 20. The fourth bonding wire 72 extends from the top surface of the second die body 66 and is electrically coupled to the fourth base metal structure 20(4) of the base metal layer 20. In different applications, the second wire-bonding die 48 may include more bonding wires. In this embodiment, the internal side of the base substrate body 18 has a second recess 74, in which the second wire-bonding die 48 is mounted. Herein, the heat spreader 24 is thermally coupled to the second wire-bonding die 48 and conducts heat generated from the second wire-bonding die 48 toward the external side of the base substrate body 18. The heat spreader 24 is directly in a heat dissipation path, and adjacent to the second wire-bonding die 48. The second base signal via 28 and the second wall signal via 42 are electrically coupled to the second wire-bonding die 48 through the fourth base metal structure 20(4) of the base metal layer 20. The second base signal via 28 is not directly in a heat dissipation path.

To improve reliability of the electronic components with large changes in temperature, moisture, and/or resultant condensation conditions, the package 10 also includes a mold compound 76 residing within the cavity 38 and over the internal side of the base substrate body 18. In one embodiment, the mold compound 76 encapsulates all of the first wire-bonding die 44, the SMD 46, and the second wire-bonding die 48. In some applications, some electronic components may be more sensitive than others in temperature changes, moisture changes, and/or resultant condensation changes. Consequently, the mold compound 76 may selectively encapsulate these sensitive electronic components. For instance, the mold compound 76 encapsulates the first wire-bonding die 44 and the SMD 46, while the second wire-bonding die 48 is exposed in the cavity 38 (not shown). In some applications, the mold compound 76 may have a lower height than the perimeter wall 16, such that there is an air gap within the cavity 38. In some applications, the mold compound 76 may have an essentially same height as the perimeter wall 16, or the mold compound 76 may fully fill the cavity 38. The mold compound 76 may be formed of epoxy resins.

The package 10 may also include a sealing material 78 used to enclose the cavity 38. The sealing material 78 extends about an exterior portion of a first junction, which is formed between the perimeter wall 16 and the internal side of the base substrate body 18, and an exterior portion of a second junction, which is formed between the perimeter wall 16 and the internal side of the secondary substrate body 30.

FIG. 2 provides an exemplary system assembly 80 including the package 10 shown in FIG. 1. Besides the package 10, the system assembly 80 also includes a printed circuit board (PCB) 82 and a patch antenna board 84. The PCB 82 includes a PCB body 86 having an upper side and a lower side, a PCB metal layer 88, a first heat sink 90, and a second heat sink 92. The PCB metal layer 88 is on the upper side of the PCB body 86, and both the first heat sink 90 and the second heat sink 92 extend from the upper side of the PCB body 86 through the PCB body 86 to the lower side of the PCB body 86. Herein, the PCB metal layer 88 includes four separate metal structures: a first PCB metal structure 88(1), a second PCB metal structure 88(2), a third PCB metal structure 88(3), and a fourth PCB metal structure 88(4). These PCB metal structures 88(1)-88(4) of the PCB metal layer 88 may be formed as metal pads and/or traces. In different applications, the PCB metal layer 88 may include fewer or more PCB metal structures. The external side of the base substrate body 18 is coupled to the upper surface of the PCB body 86, such that the first base signal via 26 and the second base signal via 28 are electrically coupled to the PCB 82 by the first PCB metal structure 88(1) and the fourth PCB metal structure 88(4) of the PCB metal layer 88, respectively. The thermal vias 22 are thermally coupled to the first heat sink 90 by the second PCB metal structure 88(2) of the PCB metal layer 88. The heat spreader 24 is thermally coupled to the second heat sink 92 by the third PCB metal structure 88(3) of the PCB metal layer 88. Note that the first heat sink 90 and the second heat sink 92 are also thermal management components, and may include thermal vias and/or a slug.

In addition, the patch antenna board 84 includes a board body 94 having an upper side and a lower side, a board metal layer 96, a first board signal via 98, a second board signal via 100, a first antenna patch 102, and a second antenna patch 104. The board metal layer 96 is on the lower side of the board body 94, and the first and second antenna patches 102 and 104 are on the upper side of the board body 94. Herein, the board metal layer 96 includes two separate board metal structures: a first board metal structure 96(1) and a second board metal structure 96(2). These board metal structures 96(1)-96(2) may be formed as metal pads and/or traces. In different applications, the board metal layer 96 may include a different number of board metal structures. The first antenna patch 102 and the second antenna patch 104 may be separate from each other and formed of metal plates. In different applications, the patch antenna board 84 may include a different number of antenna patches. The first board signal via 98 extends through the board body 94 and is electrically coupled to the first board metal structure 96(1) and the first antenna patch 102. The second board signal via 100 extends through the board body 94 and is electrically coupled to the second board metal structure 96(2) and the second antenna patch 104.

The external side of the secondary substrate body 30 is coupled to the lower surface of the board body 94, such that the first secondary signal via 34 and the second secondary signal via 36 are electrically coupled to the patch antenna board 84 by the first board metal structure 96(1) and the second board metal structure 96(2) of the board metal layer 96, respectively. It is clear that signals may be transmitted between the first wire-bonding die 44 and the patch antenna board 84 through the first base metal structure 20(1), the first wall signal via 40, the first secondary metal structure 32(1), the first secondary signal via 34, and the first board metal structure 96(1). Signals may also be transmitted between the second wire-bonding die 48 and the patch antenna board 84 through the fourth base metal structure 20(4), the second wall signal via 42, the second secondary metal structure 32(2), the second secondary signal via 36, and the second board metal structure 96(2). Notice that the package 10 has dual signal-transition sides: the external side of the base substrate body 18 and the external side of the secondary substrate body 30. In some applications, there may be one or more electronic components mounted on the internal side of the secondary substrate 14 and within the cavity 38 (not shown). The dual signal-transition sides of the package 10 may enhance the integration of the package 10.

FIG. 3 provides an alternative package 10A according to one embodiment of the present disclosure. Compared to the package 10, the alternative package 10A omits the secondary substrate 14. Herein, the perimeter wall 16 extends from the periphery of the internal side of the base substrate body 18 to form a cavity 38A that is over the internal side of the base substrate body 18 and within the perimeter wall 16. The mold compound 76 resides within the cavity 38A and over the internal side of the base substrate body 18. In one embodiment, the mold compound 76 encapsulates all of the first wire-bonding die 44, the SMD 46, and the second wire-bonding die 48. In some applications, some electronic components may be more sensitive than others in temperature changes, moisture changes, and/or resultant condensation changes. Consequently, the mold compound 76 may selectively encapsulate these sensitive electronic components. For instance, the mold compound 76 encapsulates the first wire-bonding die 44 and the SMD 46, while the second wire-bonding die 48 is exposed in the cavity 38A (not shown). In some applications, the mold compound 76 may have a lower height than the perimeter wall 16; while in some applications, the mold compound 76 may have an essentially same height as the perimeter wall 16. Note that the mold compound 76 does not extend beyond the perimeter wall 16. In the alternative package 10A, there is no junction formed between the perimeter wall 16 and the secondary substrate body 30. As such, the sealing material 78 only extends about the exterior portion of the first junction, which is formed between the perimeter wall 16 and the internal side of the base substrate body 18.

FIG. 4 provides an exemplary system assembly 80A including the alternative package 10A shown in FIG. 3. Besides the alternative package 10A, the system assembly 80A also includes the PCB 82 and the patch antenna board 84. The external side of the base substrate body 18 is coupled to the upper surface of the PCB body 86, such that the first base signal via 26 and the second base signal via 28 are electrically coupled to the PCB 82 by the first PCB metal structure 88(1) and the fourth PCB metal structure 88(4) of the PCB metal layer 88, respectively. The thermal vias 22 are thermally coupled to the first heat sink 90 by the second PCB metal structure 88(2) of the PCB metal layer 88. The heat spreader 24 is thermally coupled to the second heat sink 92 by the third PCB metal structure 88(3) of the PCB metal layer 88.

For the purpose of this illustration, the board metal layer 96 of the patch antenna board 84 includes two separate board metal structures: the first board metal structure 96(1) and the second board metal structure 96(2), which may be formed as metal pads and/or traces. In different applications, the board metal layer 96 may include a different number of board metal structures. Herein, the first board signal via 98 extends through the board body 94 and is electrically coupled to the first board metal structure 96(1) and the first antenna patch 102. The second board signal via 100 extends through the board body 94 and is electrically coupled to the second board metal structure 96(2) and the second antenna patch 104.

The patch antenna board 84 directly resides over the perimeter wall 16, such that the lower side of the board body 94 is directly coupled to the perimeter wall 16. The open cavity 38A is enclosed as an enclosed cavity 106, which is defined by a portion of the internal side of the base substrate body 18, the perimeter wall 16, and a portion of the lower side of the board body 94. The mold compound 76 resides within the enclosed cavity 106. If the mold compound 76 has an essentially same height as the perimeter wall 16, the mold compound 76 may provide mechanical support to the patch antenna board 84. If the mold compound 76 has a lower height than the perimeter wall 16, there is an air gap within the enclosed cavity 106.

Herein, the first wall signal via 40 and the second wall signal via 42 are electrically coupled to the patch antenna board 84 by the first board metal structure 96(1) and the second board metal structure 96(2) of the board metal layer 96, respectively. It is clear that signals may be transmitted between the first wire-bonding die 44 and the patch antenna board 84 through the first base metal structure 20(1), the first wall signal via 40, and the first board metal structure 96(1). Signals may also be transmitted between the second wire-bonding die 48 and the patch antenna board 84 through the fourth base metal structure 20(4), the second wall signal via 42, and the second board metal structure 96(2).

As shown in FIGS. 1 and 3, signal transmission and heat dissipation of the package 10/10A performs at a same plane (the external side of the base substrate body 18). However, in some applications, signal transmission and heat dissipation are desired to be separate to enhance the high frequency performance of the package. FIG. 5 provides an alternative package 10B which is able to separate signal transmission and thermal management into different planes. Compared to the package 10, the alternative package 10B includes the same secondary substrate 14, the same perimeter wall 16, the same first wire-bonding die 44, the same surface mounted device (SMD) 46, the same second wire-bonding die 48, and the same mold compound 76, but an alternative base substrate 12B. The alternative base substrate 12B includes the base substrate body 18, the base metal layer 20, the thermal vias 22, the heat spreader 24, and an external metal layer 108. The external metal layer 108 resides on the external side of the base substrate body 18, and is thermally coupled to the thermal vias 22 and the heat spreader 24. In this embodiment, the external metal layer 108 may be a continuous plate or sheet.

The thermal vias 22 are adjacent to the first wire-bonding die 44, and extend from the internal side of the base substrate body 18 through the base substrate body 18 to the external side of the base substrate body 18. As such, the thermal vias 22 conduct heat generated from the first wire-bonding die 44 toward the external metal layer 108 on the external side of the base substrate body 18. The heat spreader 24 is adjacent to the second wire-bonding die 48, and extends from the internal side of the base substrate body 18 through the base substrate body 18 to the external side of the base substrate body 18. As such, the heat spreader 24 conducts heat generated from the second wire-bonding die 48 toward the external metal layer 108 on the external side of the base substrate body 18. Note that the alternative base substrate 12B does not include any base signal via. Therefore, there is only heat but no signal transferred towards the external side of the base substrate body 18.

In addition, the first wire-bonding die 44 may transmit/receive signals through the first bonding wire 54, the first base metal structure 20(1), the first wall signal via 40, the first secondary metal structure 32(1), the first secondary signal via 34, and towards/from the external side of the secondary substrate body 30. Similarly, the second wire-bonding die 48 may transmit/receive signals through the fourth bonding wire 72, the fourth base metal structure 20(4), the second wall signal via 42, the second secondary metal structure 32(2), the second secondary signal via 36, and towards/from the external side of the secondary substrate body 30. Therefore, only the external side of the secondary substrate body 30 is used for signal transmission. It is clear that the alternative package 10B is able to separate signal transmission and thermal management into different planes (the external side of the secondary substrate body 30 and the external side of the base substrate body 18).

FIG. 6 provides an alternative system assembly 80B including the alternative laminate-based package shown in FIG. 5. Besides the alternative package 10B, the system assembly 80A also includes an alternative PCB 82B and a cold plate 110. The alternative PCB 82 includes the PCB body 86 and the PCB metal layer 88, but does not include any heat sink. Herein, the PCB metal layer 88 is on the upper side of the PCB body 86, and includes two separate metal structures: a first PCB metal structure 88(1) and a second PCB metal structure 88(2). These PCB metal structures 88(1)-88(2) of the PCB metal layer 88 may be formed as metal pads and/or traces. In different applications, the PCB metal layer 88 may include fewer or more PCB metal structures. The external side of the secondary substrate body 30 is coupled to the upper surface of the PCB body 86, such that the first secondary signal via 34 and the second secondary signal via 36 are electrically coupled to the alternative PCB 82B by the first PCB metal structure 88(1) and the second PCB metal structure 88(2), respectively.

In addition, the cold plate 110 resides over and is thermally coupled to the external metal layer 108 on the external side of the base substrate body 18. Consequently, the heat generated from the electronic components mounted on the inner side of the base substrate body 18 (like the first wire-bonding die 44 and the second wire-bonding die 48) is conducted to the cold plate 110 through the thermal management components (like the thermal vias 22 and the heat spreader 24). Accordingly, signals will be transmitted between the first/second wire-bonding die 44/48 and the alternative PCB 82 via the external side of the secondary substrate body 30. Heat generated from the first/second wire-bonding die 44/48 is conducted to the cold plate 110 via the external side of the base substrate body 18. In some applications, there may be one or more electronic components mounted on the internal side of the secondary substrate 14 and within the cavity 38 (not shown), which will also transit/receive signals towards/from the alternative PCB 82 via the external side of the secondary substrate body 30.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a base substrate comprising a base substrate body having an internal side and an external side, at least one base metal structure on the internal side of the base substrate body, and at least one thermal management component that extends through the base substrate body;
   a perimeter wall extending from a periphery of the internal side of the base substrate body to form a cavity that is over the internal side of the base substrate body and within the perimeter wall, wherein at least one wall signal via extends through the perimeter wall and is electrically coupled to the at least one base metal structure on the internal side of the base substrate body;
   at least one electronic component mounted on the internal side of the base substrate body, exposed to the cavity, and electrically coupled to the at least one base metal structure, wherein the at least one thermal management component is thermally coupled to the at least one electronic component and conducts heat generated from the at least one electronic component toward the external side of the base substrate body; and
   a mold compound residing over the internal side of the base substrate body and within the cavity, so as to encapsulate the at least one electronic component.

2. The apparatus of claim 1 wherein the base substrate further comprises at least one base signal via extending through the base substrate body, wherein the at least one base signal via is electrically coupled to the at least one base metal structure on the internal side of the base substrate body and separate from the at least one thermal management component.

3. The apparatus of claim 2 further comprising:
   a printed circuit board (PCB), wherein the external side of the base substrate body is over the PCB, such that the at least one base signal via is electrically coupled to the PCB and transmits signals between the at least one electronic component and the PCB; and
   a patch antenna board, which resides over the perimeter wall, wherein:
      the cavity is enclosed and defined by a portion of the internal side of the base substrate body, the perimeter wall, and a portion of the patch antenna board; and
      the at least one wall signal via is electrically coupled to the patch antenna board and transmits signals between the at least one electronic component and the patch antenna board.

4. The apparatus of claim 3 wherein the mold compound has an essentially same height as the perimeter wall and provides mechanical support to the patch antenna board.

5. The apparatus of claim 3 wherein the mold compound has a lower height than the perimeter wall, such that there is an air gap within the cavity.

6. The apparatus of claim 3 wherein the PCB comprises at least one heat sink extending through the PCB, wherein the at least one thermal management component is thermally coupled to the at least one heat sink and conducts the heat generated from the at least one electronic component to the at least one heat sink.

7. The apparatus of claim 3 further comprising:
   a first junction formed between the perimeter wall and the patch antenna board;
   a second junction formed between the perimeter wall and the internal side of the base substrate body; and a sealing material that extends about an exterior portion of the first junction and an exterior portion of the second junction to enclose the cavity.

8. The apparatus of claim 2 further comprising a secondary substrate over the perimeter wall, wherein:
the secondary substrate comprises a secondary substrate body having an internal side and an external side, at least one secondary metal structure on the internal side of the secondary substrate body, and at least one secondary signal via extending through the secondary substrate body, wherein:
the internal side of the secondary substrate body is coupled to the perimeter wall; and
the at least one secondary signal via and the at least one wall signal via are electrically coupled to the at least one secondary metal structure on the internal side of the secondary substrate body; and
the cavity is enclosed and defined by a portion of the internal side of the base substrate body, the perimeter wall, and a portion of the internal side of the secondary substrate body.

9. The apparatus of claim 8 wherein the mold compound has an essentially same height as the perimeter wall.

10. The apparatus of claim 8 wherein the mold compound has a lower height than the perimeter wall, such that there is an air gap within the cavity.

11. The apparatus of claim 8 further comprising:
a PCB, wherein the external side of the base substrate body is over the PCB, such that the at least one base signal via is electrically coupled to the PCB and transmits signals between the at least one electronic component and the PCB; and
a patch antenna board, wherein the patch antenna board is over the external side of the secondary substrate body, such that the at least one secondary signal via is electrically coupled to the patch antenna board and transmits signals between the at least one electronic component and the patch antenna board.

12. The apparatus of claim 11 wherein the PCB comprises at least one heat sink extending through the PCB, wherein the at least one thermal management component is thermally coupled to the at least one heat sink and conducts the heat generated from the at least one electronic component to the at least one heat sink.

13. The apparatus of claim 11 further comprising:
a first junction formed between the perimeter wall and the internal side of the secondary substrate body, and a second junction formed between the perimeter wall and the internal side of the base substrate body; and
a sealing material that extends about an exterior portion of the first junction and an exterior portion of the second junction to enclose the cavity.

14. The apparatus of claim 1 further comprising a secondary substrate over the perimeter wall, wherein:
the secondary substrate comprises a secondary substrate body having an internal side and an external side, at least one secondary metal structure on the internal side of the secondary substrate body, and at least one secondary signal via extending through the secondary substrate body,
the internal side of the secondary substrate body is coupled to the perimeter wall; and
the at least one secondary signal via and the at least one wall signal via are electrically coupled to the at least one secondary metal structure on the internal side of the secondary substrate body; and
the cavity is enclosed and defined by a portion of the internal side of the base substrate body, the perimeter wall, and a portion of the internal side of the secondary substrate body.

15. The apparatus of claim 14 wherein the mold compound has an essentially same height as the perimeter wall.

16. The apparatus of claim 14 wherein the mold compound has a lower height than the perimeter wall, such that there is an air gap within the cavity.

17. The apparatus of claim 14 further comprising:
a PCB, wherein the external side of the secondary substrate body is over the PCB, such that the at least one secondary signal via is electrically coupled to the PCB and transmits signals between the at least one electronic component and the PCB; and
a cold plate, wherein the cold plate is over the external side of the base substrate body, such that the at least one thermal management component is thermally coupled to the cold plate and conducts the heat generated from the at least one electronic component to the cold plate.

18. The apparatus of claim 1 wherein the at least one electronic component is one from a group consisting of a resistor, a capacitor, an inductor, a flip-chip die, a battery function die, and a wire-bonding die.

19. The apparatus of claim 1 wherein the at least one thermal management component comprises a plurality of thermal vias.

20. The apparatus of claim 1 wherein the at least one thermal management component comprises a slug.

* * * * *